United States Patent [19]

Lo

[11] Patent Number: 5,953,210
[45] Date of Patent: Sep. 14, 1999

[54] REWORKABLE CIRCUIT BOARD ASSEMBLY INCLUDING A REWORKABLE FLIP CHIP

[75] Inventor: Ching P. Lo, Palos Verdes Estates, Calif.

[73] Assignee: Hughes Electronics Corporation, Los Angeles, Calif.

[21] Appl. No.: 08/889,429

[22] Filed: Jul. 8, 1997

[51] Int. Cl.[6] ...................................................... H05K 7/20
[52] U.S. Cl. ........................ 361/704; 361/705; 361/706; 361/717; 361/718; 361/719; 257/706; 165/80.3
[58] Field of Search .................................... 361/704, 705, 361/706, 717, 1, 719, 767, 768, 749, 750, 771, 751, 783, 820; 174/16.3, 252, 254, 255, 259, 260, 52.4; 257/706, 778, 780

[56] References Cited

U.S. PATENT DOCUMENTS

| | | | |
|---|---|---|---|
| 4,698,662 | 10/1987 | Young et al. | 257/777 |
| 4,711,804 | 12/1987 | Burgess | 428/210 |
| 5,151,388 | 9/1992 | Bakhit et al. | 29/593 |
| 5,268,048 | 12/1993 | Leibovitz et al. | 156/94 |
| 5,659,203 | 8/1997 | Call et al. | 257/778 |
| 5,685,071 | 11/1997 | Gates, Jr. et al. | 174/16.3 |
| 5,723,369 | 3/1998 | Barber | 438/106 |
| 5,757,073 | 5/1998 | Hoffmeyer | 257/700 |

FOREIGN PATENT DOCUMENTS

| | | |
|---|---|---|
| 0852920 | 6/1982 | European Pat. Off. . |
| 0139431 | 5/1985 | European Pat. Off. . |
| 0737027 | 10/1996 | European Pat. Off. . |

*Primary Examiner*—Leo P. Picard
*Assistant Examiner*—Boris L. Chervinsky
*Attorney, Agent, or Firm*—Terje Gudmestad; Georgann S. Grunebach; Michael W. Sales

[57] ABSTRACT

A reworkable circuit board assembly including a flip chip adapted for removal in the event of a failure and a method for fabricating the same is disclosed. The reworkable circuit board assembly includes a heat sink having a coefficient of thermal expansion substantially matched to the coefficient of thermal expansion of the flip chip. It also includes a deformable circuit board having a first side and a second side, wherein the first side is secured to a side of the heat sink in thermal communication therewith. The flip chip is bonded to the second side of the deformable circuit board without underfill or with weak bond strength underfill to facilitate removal of the flip chip in the event of a rework.

13 Claims, 2 Drawing Sheets

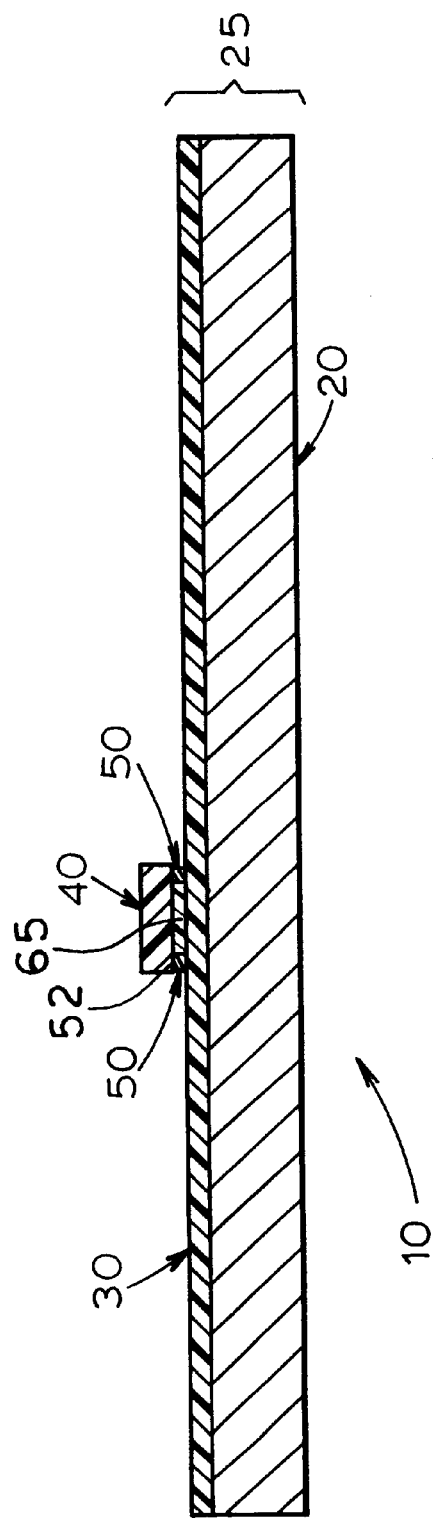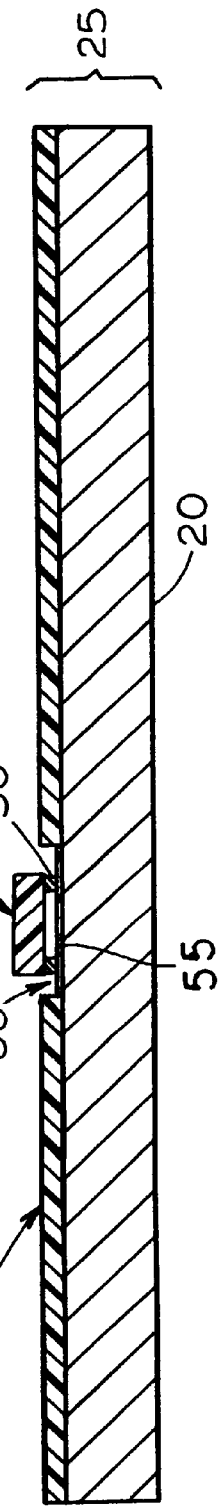

REWORKABLE CIRCUIT BOARD ASSEMBLY INCLUDING A REWORKABLE FLIP CHIP

BACKGROUND OF THE INVENTION

1. Field of the Invention

The present invention relates generally to flip chip technology and, more particularly, to reworkable circuit board assemblies including a flip chip that can be reworked in the event of failure and a method for fabricating the same.

2. Description of Related Art

The desirability of miniaturization of electronic circuitry and electronic packaging has long been known. Such miniaturization is desirable in electronics employed in various disparate applications including spacecraft, satellites, automobiles, aircraft, consumer electronics, and personal computers to name a few examples. However, heat density problems often arise with increased miniaturization. Specifically, as more electronic circuitry is condensed into smaller and smaller areas to achieve higher packaging density, the heat produced by the condensed circuitry results in a corresponding increase in heat density. Accordingly, it is desirable to provide means for achieving higher electronic packaging density with improved heat transferability.

The current state of the art design in reworkable hermetic packaging comprises multi-chip modules (MCM). MCMs are circuits partitioned into modules of approximately 20 silicon chips. These chips are physically and electronically attached to a substrate which has been assembled inside a ceramic package. After testing, the package is sealed to produce an MCM. Two or three MCMs are then bonded and soldered to each circuit board. Typically, two circuit board assemblies are then bonded to opposite sides of a heat sink to form a processor module.

While such MCMs have achieved reductions in the size and weight of circuitry and packaging, it is desirable to achieve further reductions to achieve higher packaging densities.

Flip chip technology has been proposed as a means to increase packaging density to achieve such size and weight reductions. However, existing flip chip technology suffers from certain drawbacks. For example, prior art flip chips are costly and range from difficult to nearly impossible to rework in the event of failure or other need for chip replacement. Further, while existing flip chip technology can greatly increase packaging density, it also generates high heat density. Moreover, existing flip chips may not be suitable in RF and high speed digital applications due to the lossy underfill material those chips employ.

The need for reworkability is significant. Reworkability permits the replacement of failed chips or chip to circuit board interconnect on circuit boards without replacement of other, properly functioning, components of the board or disposal of the board in its entirety. For example, space processor modules employed in spacecraft often contain tens of ASICs (Application Specific Integrated Circuits). Each such ASIC can cost thousands of dollars. If a flip chip fails in such a processor module, the non-reworkability of the failed chip can result in the disposal of the entire circuit board, possibly wasting the properly functioning ASICs at great expense.

The high cost and non-reworkability of traditional flip chips, as well as the unsuitability of those flip chips for high frequency and high speed applications, is substantially due to the requirement of underfill in those chips. More specifically, traditional flip chips typically have large mismatches between the coefficients of thermal expansion (CTE) of the Integrated Circuits (ICs) and the Printed Wiring Boards the ICs are mounted upon. The use of underfill addresses this problem by reducing the solder joint stress caused by the CTE mismatching. It also acts as a protective coating shielding the chip dies from moisture and foreign corrosive matter. However, the presence of underfill makes it very difficult, if not impossible, to remove and replace a mounted flip chip from a circuit board. The presence of underfill in the existing flip chips also renders those devices unsuitable for high frequency and high speed applications.

SUMMARY OF THE INVENTION

The present invention overcomes the drawbacks of the prior art by providing a reworkable circuit board assembly comprising: a heat sink; a deformable circuit board having a first side and a second side, the first side being secured to a side of the heat sink in thermal communication therewith; and, a flip chip bonded to the second side of the deformable circuit board without underfill to facilitate removal of the flip chip for replacement in the event of a rework, wherein the heat sink has a coefficient of thermal expansion which substantially matches a coefficient of thermal expansion of the flip chip. In the preferred embodiment, the deformable circuit board comprises a direct electrical contact array laminate which deforms to release heat induced stress in the material bonding the flip chip to the circuit board. Preferably, the bond pads of the IC associated with the flip chip are plated with corrosion resistant metal, and the IC is passivated with a protective coating such as silicon nitride or silicon carbide to protect the chip against the corrosive effects of environmental factors.

In accordance with another important aspect of the invention, a method for fabricating a circuit board assembly with a reworkable flip chip is provided. The method comprises the steps of: providing a heat sink having a coefficient of thermal expansion substantially matched to the coefficient of thermal expansion of the flip chip; securing a first side of a deformable circuit board to the heat sink; and, adhering a flip chip to a second side of the deformable circuit board opposite the first side without underfill to facilitate removal of the flip chip in the event of a rework.

BRIEF DESCRIPTION OF THE DRAWINGS

FIG. 1 illustrates a reworkable circuit board assembly constructed in accordance with the teachings of the present invention.

FIG. 2 illustrates an alternative embodiment of a reworkable circuit board assembly constructed pursuant to the invention.

DESCRIPTION OF THE PREFERRED EMBODIMENTS

Figure 3:
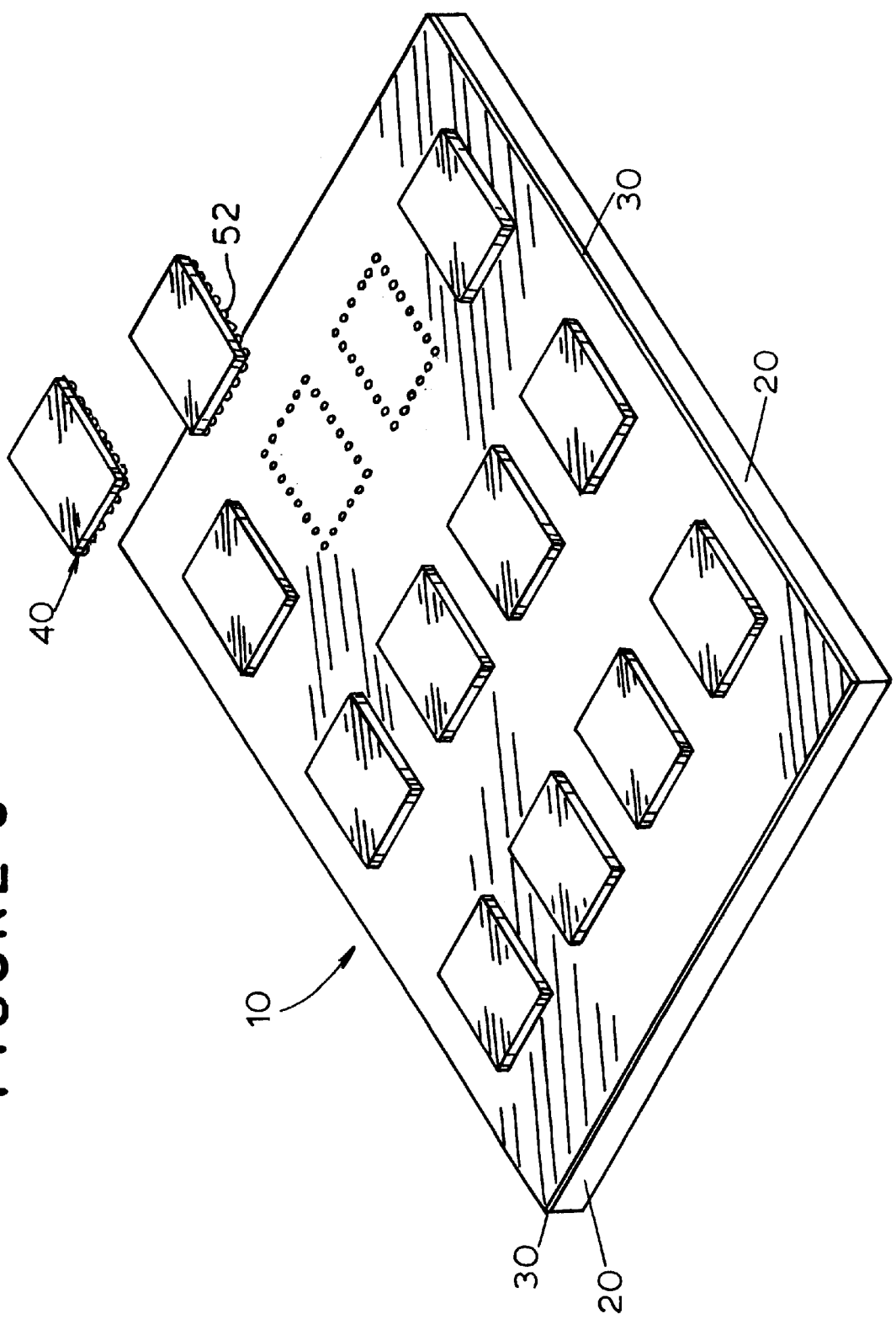
FIG. 3 is a three-dimensional view of a reworkable circuit board assembly constructed in accordance with the teachings of the inventor.

Reworkable circuit board assemblies 10 constructed in accordance with the teachings of the instant invention are illustrated in FIGS. 1 and 3. As discussed in detail below, the reworkable circuit board assembly 10 achieves reductions in size and weight over prior art circuit board assemblies while providing a reworkable flip chip that can be removed and replaced as needed.

As shown in FIG. 1, the reworkable circuit board assembly 10 is provided with a heat sink 20. The rigid heat sink 20 is preferably chosen to have a coefficient of thermal expansion (CTE) which is closely matched to the CTE of the flip chip dice. Although the CTE of the heat sink will depend on the CTE of the dice and, thus, the material the dice employs for silicon based ICs, the CTE of the heat sink is preferably lower than approximately 6 PPM/°C. for gallium arsenide ICs; and approximately 3 PPM/°C. for silicon ICs. The heat sink 20 is also preferably selected to have high thermal conductivity and a high modulus of elasticity, as well as to be light weight. Examples of materials meeting these specifications include carbon brick and metal foil carbon carbon composites. Such composites are commercially available from Applied Science, Inc. under the tradename "Black Ice", and from Amoco under the tradename "SRG Brick".

In accordance with an important aspect of the invention, the reworkable circuit board assembly 10 is further provided with a deformable circuit board 30 having a first side secured to a side of the heat sink 20 in thermal communication therewith. The compliant layer circuit board 30 is preferably selected to be high density, soft and thin. In the preferred embodiment, the deformable circuit board 30 comprises a direct electrical contact array laminate (DECAL) type printed wiring board (PWB). The DECAL may comprise multiple 1 to 2 mil thick layers of polymide-like, flexible substrate material with adhesiveless copper circuits on both sides of the substrate layers. Multi-layer DECALS can range in thickness from 2–15 mils. Preferably, the DECAL has a substantially uniform thickness of 15 mil or less. DECALS of this type employ fine lines, blind and buried vias, mini-vias, and pads to provide high density circuitry. They do not have glass fiber re-enforcement and are, thus, soft. Such DECALS are commercially available from Hughes Micro-Electronics Division under the tradename "HDMI"; from IBM under the name "SLC"; and from Sheldahl under the name "VIAGRID".

As mentioned above, the deformable circuit board 30 is secured to the heat sink 20 to form a subassembly 25. The CTE of this subassembly 25 is dominated by the CTE of the heat sink 20. Thus, in the preferred embodiment, the CTE of the subassembly 25 is on the order of 3 PPM/°C.

In accordance with another important aspect of the invention, the reworkable circuit board assembly 10 is provided with a flip chip 40 which is soldered or bonded to the second side of the deformable circuit board 30 without underfill to facilitate removal in the event of failure. Preferably, the flip chip 40 and the heat sink/deformable circuit board subassembly 25 are selected such that the CTE mismatch therebetween is minimal. To the extent a CTE mismatch exists, the soft, deformable nature of the deformable circuit board 30 will deform as needed to reduce stress in the bonded joints 50 between the flip chip 40 and the deformable circuit board/heat sink subassembly 25. Because of the reduced stress to the bond joints 50, no underfill is needed, and the flip chip 40 can be easily reworked.

The Integrated Circuits (ICs) used in the flip chip must be capable of resisting corrosion from environmental factors such as moisture and ionic contamination. Prior art flip chip circuits achieved such resistance through the use of underfill. Since the flip chips 40 of the present invention do not have underfill, another means for resisting the corrosive effects of the environment must be employed.

To this end, the aluminum bond pads 52 of the flip chip ICs employed in the present invention are preferably plated with a protective metal such as chromium Ti, nickel, gold, or any combination thereof, and the top of the die (other than the bond pads) is preferably passivated with protective coatings. In the preferred embodiment the protective coatings comprise high temperature silicon nitride, silicon carbide, or an equivalent substance.

As mentioned above, the flip chip 40 is bonded to the second side of the deformable circuit board 30. This bonding can be achieved in various manners known in the art without departing from the scope of the invention. In the presently preferred embodiments, electrically conductive adhesive or solder is used in this role.

Those skilled in the art will appreciate that reworkable circuit board assemblies 10 of the disclosed type achieve several advantages over the prior art. For example, since the heat sink 20 is highly thermally conductive and the deformable circuit board 30 is very thin, the heat sink/circuit board subassembly 25 has low thermal impedance. This characteristic renders reworkable circuit board assemblies 10 of the disclosed type particularly well suited for high circuit density and high heat concentration applications.

More specifically, circuit board assemblies 10 of the disclosed type achieve size and weight reductions over prior art devices by, among other things, attaching the flip chip 40 directly to the circuit boards 30. This approach eliminates the separate substrates, packages, and associated fabrication, assembly, and test costs typical of prior art devices such as MCMs. The use of a thin, deformable circuit board 30 also reduces the overall thickness of the reworkable circuit board assembly 10 thereby permitting higher circuit density.

Circuit board assemblies 10 constructed in accordance with the teachings of the present invention also achieve improved heat transfer by placing the flip chip 40 in close proximity to subassembly 25 without intervening underfill. The shortened thermal paths to the heat sink 20 resulting from the use of the thin, deformable circuit board 30 causes the flip chip 40 to run cooler.

Circuit board assemblies 10 constructed pursuant to the teachings of the instant invention exhibit other improvements over the prior art. For example, the passivation process employed with the flip chips 50 of such circuit board assemblies 10 provides equivalent environmental protection to the hermetic MCMs at much lower costs. Further, the elimination of underfill permits such circuit board assemblies 10 to be used in RF and high speed digital applications.

For hot flip chips, a cavity 60 can be defined in the deformable circuit board 30. As shown in FIG. 2, in such an alternative embodiment all but the bottom layer 55 of the deformable circuit board 30 will preferably be removed from the cavity 60. The flip chip 40 can then be positioned in the cavity 60 thereby further reducing the heat transfer path and, thus, the thermal impedance of subassembly 25.

For extremely high power IC's, a highly thermally conductive, low bonding strength underfill may be used with the flip chips 40 to further increase thermal conductivity without departing from the scope of the invention. Since such underfill is not designed to reduce the solder joint stress, low bonding strength, easily removable underfill adhesive may be used in the inventive circuit board assemblies 10 while maintaining the reworkability of the flip chips 40. Although other substances might likewise be appropriate in this role, in the presently preferred embodiments aluminum nitride filled Uralane is employed as the underfill adhesive.

Although, for ease of explanation, in the above embodiments the reworkable circuit board assemblies 10 have been described as having one deformable circuit board 30 and one flip chip 40, those skilled in the art will readily appreciate that more than one deformable circuit board and multiple flip chips can be employed without departing from the scope of the invention. Indeed, in the preferred embodiment, circuit density is maximized by securing a deformable circuit board 30 to each side of the heat sink 20. Thus, a single heat sink 20 is used to cool flip chips 40 disposed on two deformable circuit boards 30 positioned on opposite sides of the heat sink 20.

In accordance with an important aspect of the invention, a method for fabricating reworkable circuit board assemblies 10 of the foregoing type is provided. One preferred embodiment of such a method will now be described.

As an initial matter, the fabricator first provides a heat sink having a coefficient of thermal expansion matched to the IC dice employed in the flip chip 40 to be used in the assembly 10. Preferably, the heat sink has characteristics such as those described above in connection with heat sink 20. A deformable circuit board 30 is then secured to a first side of the heat sink. Preferably, the deformable circuit board 30 is a DECAL as described above. A flip chip 40 is then bonded to the deformable circuit board 30 without underfill to facilitate removal of the flip chip 40 in the event of a failure. The flip chip 40 is preferably bonded to the deformable circuit board 30 using electrically conductive adhesive or solder.

Preferably, the fabrication process also includes the steps of plating the bonding pads of the flip chip 40 with corrosion resistant metal and passivating the chip with a protective coating such as silicon nitride or silicon carbide to avoid corrosion and the like. In the case of a very hot chip, the fabrication process may also include the step of defining a cavity in the deformable circuit board 30 for receiving the flip chip 40 or applying a low bonding strength, easily removable underfill adhesive 65 such as aluminum nitride filled URALANE™ polymer beneath the flip chip 40.

Those skilled in the art will readily appreciate that although, for ease of explanation, the steps of the foregoing method were described as occurring in a particular time sequence, the method is not limited to any temporal arrangement. On the contrary, the steps of the inventive method can be performed in any order without departing from the scope or the spirit of the invention.

Finally, those skilled in the art will further appreciate that, although the invention has been described in connection with certain embodiments, there is no intent to limit the invention thereto. On the contrary, the intention of this application is to cover all modifications and embodiments fairly falling within the scope of the appended claims either literally or under the doctrine of equivalents.

What is claimed is:

1. A reworkable circuit board assembly comprising:

a heat sink;

a deformable circuit board having a first side and a second side, the first side being secured to a side of the heat sink in thermal communication therewith to form a heat sink/deformable circuit board assembly; and, a flip chip bonded to the second side of the deformable circuit board without underfill to facilitate removal of the flip chip for replacement in the event of a rework, wherein the heat sink has a coefficient of thermal expansion which substantially matches a coefficient of thermal expansion of the flip chip, the deformable circuit board being deformable to release heat-induced stress in a joint between the flip chip and the heat sink/deformable circuit board assembly.

2. A reworkable circuit board assembly as defined in claim 1 wherein the coefficient of thermal expansion of the heat sink is in a range of approximately 3 PPM/°C. to 6 PPM/°C.

3. A reworkable circuit board assembly as defined in claim 1 wherein the flip chip is bonded to the deformable circuit board with electrically conductive adhesive.

4. A reworkable circuit board assembly as defined in claim 1 wherein the flip chip is bonded to the deformable circuit board with solder.

5. A reworkable circuit board assembly as defined in claim 1 wherein the deformable circuit board comprises a direct electrical contact array laminate.

6. A reworkable circuit board assembly as defined in claim 1 wherein the deformable circuit board has a substantially uniform thickness from its first side to its second side of less than approximately 15 mil.

7. A reworkable circuit board assembly as defined in claim 1 wherein the deformable circuit board defines a cavity in its second side for receiving the flip chip.

8. A reworkable circuit board assembly as defined in claim 7 wherein the flip chip includes an IC having bond pads, and a bottom layer of the deformable circuit board disposed in the cavity contacts the bond pads of the IC.

9. A reworkable circuit board assembly as defined in claim 1 wherein the flip chip has an IC having bond pads which are plated with corrosion resistant metal.

10. A reworkable circuit board assembly as defined in claim 1 wherein the flip chip has an IC which is passivated with a protective coating.

11. A reworkable circuit board assembly as defined in claim 10 wherein the protective coating comprises one of the group consisting of: silicon nitride and silicon carbide.

12. A reworkable circuit board assembly comprising:

a heat sink;

a deformable circuit board having a first side and a second side, the first side being secured to a side of the heat sink in thermal communication therewith; and, a flip chip bonded to the second side of the deformable circuit board with a weak bond strength, thermally conductive underfill adhesive to facilitate removal of the flip chip for replacement in the event of a rework, wherein the heat sink has a coefficient of thermal expansion which substantially matches a coefficient of thermal expansion of the flip chip, the deformable circuit board being deformable to release heat-induced stress in a joint between the flip chip and a heat sink/deformable circuit board assembly.

13. A reworkable circuit board assembly as define in claim 12 wherein the underfill adhesive comprises aluminum nitride filled with Uralane.

\* \* \* \* \*